(12) United States Patent
Krasnov

(10) Patent No.: US 11,095,088 B1
(45) Date of Patent: Aug. 17, 2021

(54) MULTI-PASS COAXIAL MOLECULAR GAS LASER

(71) Applicant: ZOKYA LLC, Moscow (RU)

(72) Inventor: Alexander V. Krasnov, Medway, MA (US)

(73) Assignee: ZOYKA LLC, Moscow (RU)

( * ) Notice: Subject to any disclaimer, the term of this patent is extended or adjusted under 35 U.S.C. 154(b) by 56 days.

(21) Appl. No.: 16/281,760

(22) Filed: Feb. 21, 2019

Related U.S. Application Data

(60) Provisional application No. 62/633,424, filed on Feb. 21, 2018.

(51) Int. Cl.
| | | |
|---|---|---|
| *H01S 3/07* | (2006.01) | |
| *H01S 3/0943* | (2006.01) | |
| *H01J 37/32* | (2006.01) | |
| *H01S 3/0979* | (2006.01) | |
| *H01S 3/03* | (2006.01) | |

(52) U.S. Cl.
CPC ...... *H01S 3/0943* (2013.01); *H01J 37/32449* (2013.01); *H01S 3/03* (2013.01); *H01S 3/073* (2013.01); *H01S 3/076* (2013.01); *H01S 3/0979* (2013.01)

(58) Field of Classification Search
CPC ........ H01S 3/0943; H01S 3/081; H01S 3/073; H01S 3/03; H01S 3/0979; H01S 3/0813–0818; H01S 3/083–0835; H01S 3/0971–0975; H01J 37/32449
See application file for complete search history.

(56) References Cited

U.S. PATENT DOCUMENTS

| | | | |
|---|---|---|---|
| 3,543,179 | A | 11/1970 | Wilson |
| 3,621,461 | A | 11/1971 | Cason, III et al. |
| 3,681,710 | A | 8/1972 | Lary et al. |
| 3,694,770 | A | 9/1972 | Burwell et al. |
| 3,748,594 | A | 7/1973 | Pugh |
| 3,781,709 | A | 12/1973 | Hintringer |
| 3,998,393 | A | 12/1976 | Petty |
| RE29,103 | E | 1/1977 | Wilson et al. |
| 4,005,374 | A | 1/1977 | Levatter et al. |
| 4,064,465 | A | 12/1977 | Hundstad et al. |
| 4,088,966 | A | 5/1978 | Samis |
| 4,100,507 | A | 7/1978 | Born et al. |
| 4,136,317 | A | 1/1979 | Stregack et al. |
| 4,194,169 | A | 3/1980 | Rich et al. |
| 4,200,819 | A | 4/1980 | Haslund |

(Continued)

FOREIGN PATENT DOCUMENTS

| | | |
|---|---|---|
| DE | 2226392 | 12/1973 |
| EP | 0429652 | 6/1991 |

(Continued)

*Primary Examiner* — Xinning (Tom) Niu
(74) *Attorney, Agent, or Firm* — Nath, Goldberg & Meyer

(57) ABSTRACT

A multi-pass coaxial molecular gas laser is described in both symmetrical and asymmetrical configuration. An anode vessel receives lasing gas and the gas flows through one or more plasma channels to a cathode vessel which receives the gas and redirects it in the closed system. A second anode vessel may alternatively be provided to double length of the plasma channel and increase surface area exposure of the optical beam to the energized gas. Non-laminar gas flow may be created using spiral nozzles at the entrance of the optical resonator.

16 Claims, 8 Drawing Sheets

(56) References Cited

U.S. PATENT DOCUMENTS

| | | | |
|---|---|---|---|
| 4,206,429 A | 6/1980 | Pinsley | |
| 4,237,428 A | 12/1980 | Wexler et al. | |
| 4,251,781 A | 2/1981 | Sutter, Jr. | |
| 4,413,345 A | 11/1983 | Altmann | |
| 4,457,000 A | 6/1984 | Rao | |
| 4,598,406 A | 7/1986 | Fino et al. | |
| 4,620,306 A * | 10/1986 | Sutter, Jr. | H01S 3/097 372/38.05 |
| 4,635,270 A | 1/1987 | Gurs | |
| 4,651,325 A | 3/1987 | Wang et al. | |
| 4,677,635 A | 6/1987 | Marciniak et al. | |
| 4,686,681 A | 8/1987 | Paranto et al. | |
| 4,756,000 A | 7/1988 | Macken | |
| 4,805,182 A | 2/1989 | Laakmann | |
| 4,837,772 A | 6/1989 | Laakmann | |
| 4,841,537 A | 6/1989 | Alexandrov et al. | |
| 4,873,695 A | 10/1989 | Brunet et al. | |
| 4,875,218 A | 10/1989 | Hongo et al. | |
| 4,885,754 A | 12/1989 | Egawa | |
| 4,937,834 A | 6/1990 | Egawa | |
| 4,939,738 A | 7/1990 | Opower | |
| 4,964,136 A | 10/1990 | Egawa | |
| 4,972,427 A | 11/1990 | Streifer et al. | |
| 4,974,229 A | 11/1990 | Egawa | |
| 5,008,894 A | 4/1991 | Laakmann | |
| 5,038,357 A | 8/1991 | Lavarini et al. | |
| 5,067,135 A | 11/1991 | Perzl et al. | |
| 5,091,914 A | 2/1992 | Maeda et al. | |
| 5,109,463 A | 4/1992 | Lee | |
| 5,153,892 A | 10/1992 | Kawakubo et al. | |
| 5,200,971 A | 4/1993 | Wildermuth et al. | |
| 5,206,876 A | 4/1993 | von Buelow et al. | |
| 5,239,553 A | 8/1993 | Ono et al. | |
| 5,313,486 A | 5/1994 | Nakatani | |
| 5,313,487 A | 5/1994 | Fujikawa et al. | |
| 5,373,528 A | 12/1994 | Kuzumoto et al. | |
| 5,412,681 A | 5/1995 | Eisel et al. | |
| 5,475,703 A | 12/1995 | Scalise et al. | |
| 5,682,400 A | 10/1997 | Krasnov | |
| 6,005,349 A | 12/1999 | Kunhardt et al. | |
| 6,137,818 A | 10/2000 | Jackson | |
| 6,198,762 B1 | 3/2001 | Krasnov | |
| 6,636,545 B2 | 10/2003 | Krasnov | |
| 2002/0097767 A1 | 7/2002 | Krasnov | |
| 2003/0174325 A1 | 9/2003 | Zhang et al. | |
| 2004/0237888 A1 | 12/2004 | Codella et al. | |
| 2006/0007978 A1 | 1/2006 | Govorkov | |
| 2007/0228288 A1 | 10/2007 | Smith | |
| 2008/0095209 A1 | 4/2008 | Wakabayashi | |
| 2008/0144675 A1* | 6/2008 | Spinelli | H01S 3/123 372/15 |
| 2008/0296258 A1* | 12/2008 | Elliott | B23K 26/12 216/66 |
| 2010/0117009 A1 | 5/2010 | Moriya | |
| 2012/0006798 A1* | 1/2012 | Eguchi | H01S 3/036 219/121.67 |
| 2017/0179668 A1 | 6/2017 | Krasnov | |

FOREIGN PATENT DOCUMENTS

| | | |
|---|---|---|
| EP | 0852835 | 9/2004 |
| EP | 2489105 | 8/2012 |
| JP | 59-68986 | 4/1984 |
| JP | 61-170087 | 7/1986 |
| JP | 62046580 | 2/1987 |
| JP | 8-32151 | 2/1996 |
| JP | 2509638 | 6/1996 |
| JP | 2006060256 A | 3/2006 |
| RU | 2411619 | 2/2011 |
| WO | 2015149076 | 10/2015 |

\* cited by examiner

MULTI-PASS COAXIAL MOLECULAR GAS LASER

BACKGROUND

Powerful lasers can be created by optically resonating one or more laser beams through plasmatic media. Plasmatic media may be formed by exciting a gas flow using, for example, a high frequency discharge (HFD) electrodes and/or radio frequency (RF) excitation, which may be powered by an HFD and/or RF power supply, respectively. Many gas lasers utilize a gas flow having an increased flow rate created by a high speed blower that circulates the gas medium through an optical resonating chamber. The optical resonating chamber allows for energy transfer between the power supply and source to the gas in order to excite the laser light while it travels through the optical resonating chamber. The type of gas utilized, speed of gas, quality of gas flow, amount of and method for powering the electrodes as well as surface area of the resonator chambers all contribute to the efficiency of the laser (wall plug efficiency) as well as output power of the laser light.

Oftentimes, the gas circulating within the laser is retained in a closed loop system in order to allow for high speed recirculation of the gas into the optical resonator chamber in a controlled fashion. These closed loop style laser systems rely on high speed turbo-pumps to circulate the lasing gas but allow for control of the environmental characteristics of the closed loop system including temperature, lasing gas speed, internal volumetric pressures, and other factors which directly impact the effectiveness of the energy transfer to the lasing gas in order to energize the laser light within the optical resonator. However such closed loop systems are often limited by the optical resonator volume, efficiency and total area within which the lasing gas and optical resonator must accomplish effective transfer of energy to the laser.

SUMMARY

Implementations set forth herein relate generally to apparatus and methods for providing a closed loop sub-sonic or supersonic gas flow laser in a closed loop system that maximizes the optical efficiency of the lasing gas by providing multiple passes of the optical beam through the plasmatic gas formed in the optical chamber. Various implementations result in increased energy transfer to the optical beam within the optical cavity, more efficient use of the lasing gas in a closed loop circulation system and substantially increased wall plug efficiency of the laser overall.

In some implementations, various structures are set forth providing both an anode vessel and a cathode vessel which funnels the gas within the closed loop system in order to circulate the lasing gas while also increasing the exposed surface area of the plasmatic gas to multiple passes of the optical beam through the optical resonator. By both increasing the surface area of the plasmatic gas to the optical beam and minimizing the overall size of the optical resonator, substantial increases in laser power and efficiency are exhibited. For example, providing a multiple pass optical resonator cavity from an anode gas vessel to a central cathode gas vessel increases the ability to direct the optical beam through a high number of passes through the generated plasmatic gas and provide for a small overall footprint of the laser housing. For example, in some implementations, the multiple pass closed loop axial gas flow laser described herein can exhibit a wall plug efficiency of up to 20% to 25%.

In some implementations, various techniques and apparatus are set forth which include a closed loop gas flow system designed for multiple passes of an optical beam through a plurality of plasma channels thereby maximizing exposure of highly energized plasma gas to the optical beam. For example, multiple anode vessels may be used and can include providing a first and a second anode vessel receiving gas inflow and passing the energized lasing gas through a plurality of parallel plasma channels leading to a cathode vessel. In some examples, these plurality of parallel plasma channels may form a concentric ring in a compact configuration. In some implementations, this compact configuration can include an annular configuration of the plurality of plasma channels. In various implementations, these plasma channels Additional embodiments disclose use of multiple anode vessels with a centralized cathode vessel for directing the recirculated gas through the plurality of plasma channels in an optical resonator area. For example, in some implementations, a first anode vessel and a second anode vessel may receive recirculated lasing gas from a high speed turbo pump and each may redirect the lasing gas past electrodes leading to the plasma channels towards a central cathode vessel. The lasing gas may be provided through parallel coaxial plasma channels/optical resonators which contain lasing gas in a first direction towards the cathode vessel and in a second opposing direction to the cathode vessel. The optical beam may be allowed to traverse the lasing gas in both a first and a second coaxially aligned plasma channels/optical resonator before being redirected to an adjacent plasma tube/optical resonator, while also being exposed to high energy plasma within both of the coaxially aligned plasma channels. In such implementations, the cathode vessel may receive the energized lasing gas from both anode vessels and redirect the lasing gas towards the pump such that the gas may be recirculated. For example, a first anode vessel and a second anode vessel may be positioned on either ends of the laser resonance cavity housing, each of the anode vessels feeding the plasma channels. In such embodiments, a centrally positioned cathode vessel receives the lasing gas from the anode vessels thereby providing a symmetrical configuration for the laser and gas flow.

In some implementations, a single anode vessel may be utilized to provide a more compact footprint of the laser housing and configuration. For example, in such implementations, the anode vessel may receive high speed lasing gas and transfer the gas to a plurality of coaxial plasma channels leading to a cathode vessel. In such configuration, the lasing gas is provided in a first anode vessel and is equally redirected to the plasma channels/optical resonators in a first direction towards the cathode vessel. The cathode vessel receives the lasing gas and redirects it to the recirculation system. As well, optical resonators may be combined with the high speed gas flow. For example, an optical beam may be provided and redirected through the coaxial plasma channels for multiple passes through the plasma channels before exiting the cathode and/or anode vessel.

In utilizing a large number of substantially parallel plasma channels to form the optical resonator in either a symmetrical or asymmetrical configuration, the overall cross sectional area of the gas flow is sufficiently high enough to support high power energy excitation for laser emission. The substantially parallel plasma channels forming the optical resonator are modular wherein each module of plasma channels may, in some examples, be formed by pairs of commonly aligned plasma channels which form a modular pair of substantially aligned tubes or channels. Each pair of channels works independent of the other pairs of channels and by providing modularity of the channel pairs, the overall design can be readily modified to increase or decrease the number of pairs and hence the overall length and power of the resonator chamber. A module may also be formed from single asymmetrical plasma channel as described herein.

In various implementations, the module pairs can be stacked on top of each other to increase the number of pairs of resonator plasma channel pairs. Each of the stacked pairs can be connected by configuring light reflector bridges between a lower module and the module directly in place above it.

In implementations, the individual anodes are positioned upstream from the plasma channels and leading into the plasma channels. In some examples, the anodes will be positioned adjacent to both a first and a second anode vessel leading to a plurality of plasma channels towards a cathode vessel. In other implementations, the anodes may be positioned adjacent only a first anode vessel leading to a plurality of coaxially aligned plasma channels/optical resonators in a first direction towards the cathode vessel.

In order to provide sufficient electrical power to each plasma tube, each anode may be connected to a single power supply. For example, in various implementations, each anode leading to a plasma tube may be connected to an individual high voltage DC power supply which provides approximately 1 kW of power. Alternatively, for example, a single high power high voltage DC power supply may be provided and connected to a plurality of anodes.

In variations, the single high voltage or plurality of smaller high voltage power supplies may be utilized in either the symmetrical laser configuration or in the asymmetrical laser configuration.

The plurality of optical resonators/plasma channels may be configured in a paired coaxial alignment, such as for example in the symmetrical configuration, or may be positioned in a substantially parallel configuration, such as for example in the asymmetrical configuration. In some implementations, the optical beam may be directed through multiple optical resonator pairs of coaxially aligned plasma gas channels wherein the optical beam is directed through a first plasma channel in a direction of the gas flow, and continues through a second plasma gas channel in a direction against the gas flow, towards a mirror for redirection to an adjacent optical resonator pair. At least three plasma channels and/or optical resonator pairs may be utilized.

Alternatively, or in addition thereto, a plurality of optical resonators/plasma channels may be configured in substantially parallel alignment wherein the optical beam extends only through a single plasma gas channel before being redirected to an adjacent optical resonator/plasma gas channel.

In other aspects, the optical resonator can be formed from a first anode vessel which is substantially open in the interior, and a cathode vessel wherein they are positioned to form an internal resonator cavity allowing the lasing gas to flow and the laser activity to resonate with the appropriate mirrors. Lasing gas can flow from the turbo fan to a gas feed line to the anode vessel. The anode vessel may contain the electrical anode connected to the power supply and allow gas to flow therein and downstream towards the cathode vessel. The lasing gas may flow through the anode vessel and be directed through nozzles to create turbulent lasing gas flow in order to improve plasma uniformity. Downstream of the anode vessel may be positioned the cathode vessel with the appropriate cathode connections. The optical resonance within the resonator cavity may be implemented by a plurality of mirrors optically aligned within the cathode and the anode vessel to allow for lasing and energization.

In further implementations, the open interior optical resonator design may be enhanced by stacking a second anode vessel in co-linear alignment with the first anode vessel and on the other side of the cathode vessel. In implementations, the turbo fan can feed lasing gas from the fan to both the first anode vessel and the second anode vessel. An anode can be provided in the opposing ends of the combined first and second anode vessel with an interposed cathode vessel therebetweeen. The first and the second anode positioned in respective anode vessels are connected to the power supply. The cathode vessel may be connected to ground or other required connection at the power supply as well or elsewhere as electrically required to maintain proper power differentials.

The formed optical resonator within the combined first anode vessel, second anode vessel and cathode vessel can utilize a plurality of resonator mirrors on either opposing ends of the first and the second anode vessels to allow for resonance of the lasing light until exiting through the exit aperture.

In alternative implementations, for lasing amplification, a telescopic optical resonator with additional optical connection may be developed. There mirrors may be combined to include a spherical concave reflector in one anode vessel having maximal reflectiveness. A smaller convex reflector may be opposed to the concave mirror for selection and amplification of the central mode TEM000 or TEM01 laser to create minimal divergence of the beam. A small output coupler mirror of ZnSe partially transmissive may be utilized for laser emission out of the resonator cavity.

In some implementations, a multi-pass coaxial gas laser is described which may include a first anode vessel, a second anode vessel and a cathode vessel, the cathode vessel positioned between the first anode vessel and the second anode vessel. The system may also have a first gas feed line extending from a turbo pump to the first anode vessel, a second gas feed line extending from the turbo pump to the second anode vessel and a return gas feed line connecting the cathode vessel to the turbo pump. The gas feed lines may direct the lasing gas to at least three plasma channels extending from the first anode vessel to the cathode vessel, the four plasma channels substantially parallel to one another and each of the respective plasma channels having an entrance, each of the plasma channel entrances having a spiral gas flow nozzle adjacent to an anode. Included therewith may be at least three plasma channels extending from the second anode vessel to the cathode vessel, the four plasma channels substantially parallel to one another and each of the respective plasma channels having an entrance, each of the plasma channel entrances having a spiral gas flow nozzle adjacent to an anode. In providing electrical power, each of the anodes in the first anode vessel and the second anode vessel having a DC power supply. Further, each plasma channel from the first anode vessel to the cathode vessel has a co-linear plasma channel extending from the cathode vessel to the second anode vessel forming a plasma channel pair, the coaxial gas laser having at least three plasma channel pairs. The cathode vessel may position a cathode between each plasma channel pair and the return gas feed line may connect the cathode vessel to the turbo pump having a heat exchanger. The system may include a laser light rear reflecting mirror allowing a laser to reflect into the resonator chamber in the first anode vessel and into one of the at least three plasma channels extending from the first anode vessel to the cathode vessel and may further include a laser light output coupler allowing the laser to exit the first anode vessel. Internally within the laser assembly, a plurality of angled mirrors may be positioned within the first anode vessel and second anode vessel to redirect laser light to an adjacent plasma channel pair.

These and other implementations may include on or more of the following features. For example, the multi-pass coaxial gas laser may provide each of the plasma channels in the first anode vessel and each of the plasma channels in the second anode vessel with an exit, at least one of the exits including an optional cathode stabilizer. Further, each of the cathode stabilizers may be a stainless steel or other metal or alloy ring to improve the generated plasma uniformity. In implementations, each of the spiral gas flow nozzles may include a plurality of apertures. Alternatively or in addition thereto, each of the apertures for each of the spiral gas flow nozzles may have an associated deflector and each of the deflectors may alternatively or in addition thereto be angled at about 45 degrees. Further, each of the plasma channels may be a dielectric tube. As well, in implementations, each of the at least three plasma channels of the first anode vessel may have an associated glass enclosing tube within the first anode vessel leading to the associated plasma channel and each of the at least three plasma channels of the second anode vessel may have an associated glass enclosing tube within the second anode vessel leading to the associated plasma channel. Further, in implementations, the angled mirrors which redirect laser light to an adjacent plasma channel pair may include a connecting tube extending from an angled mirror of a first plasma channel pair to an angled mirror of a second plasma channel pair, the first plasma channel pair adjacent the second plasma channel pair.

In various implementations, a multi-pass coaxial gas laser is described which includes at least three plasma channel pairs extending from a first anode vessel to a second anode vessel, each of the at least three plasma channel pairs extending through a cathode vessel. The laser may include the first anode vessel receiving lasing gas from a turbo fan and the second anode vessel receiving lasing gas from the turbo fan where the turbo fan receives the lasing gas from the cathode vessel. In various examples and implementations, each plasma channel pair may have a first anode and a first spiral nozzle adjacent the first anode vessel and a second anode and second spiral nozzle adjacent the second anode vessel, the first anode connected to a first power supply and the second anode connected to a second power supply. Such may include addition or alternatively therein a first narrowed plasma chamber downstream from the first spiral nozzle adjacent the first anode vessel and a second narrowed plasma chamber downstream from the second spiral nozzle adjacent the second anode vessel as well as a shared cathode within the cathode vessel. In such implementations, the first laser light receiving tube extending through the first anode vessel to the first anode and a second light receiving tube extending through the second anode vessel to the second anode. Further, implementations may alternatively or in addition incorporate at least one of an angled redirection mirror to redirect laser light to an adjacent plasma channel pair or receive laser light from an adjacent plasma channel pair.

These and other implementations may include on or more of the following features.

In aspects, the multi-pass coaxial gas laser may have a heat exchanger upstream from the turbo fan and further may include a laser light reflecting mirror at the first anode vessel into at least one plasma channel pair, as well as a laser light output coupler which extends through the first anode vessel from a second plasma channel pair. Further, in implementations, the system may include the first power supply and the second power supply be a high voltage DC power supply.

Alternatively, or in addition, the multi-pass coaxial gas laser implementations may include a plurality of plasma channel pairs that are positioned annularly around a gas laser housing. Implementations alternatively may include a plurality of plasma channel pairs that are non-annularly spaced along a single plane.

In some implementations, the gas laser may have a shared cathode that is commonly grounded for each of the plasma channel pairs. Further, in some embodiments, each plasma channel pair further may have an optional first cathode stabilizer adjacent the first narrowed plasma chamber and downstream from the first narrowed plasma chamber, and an optional second cathode stabilizer adjacent the second narrowed plasma chamber and downstream from the second narrowed plasma chamber. Aspects may further incorporate the first cathode stabilizer and the second cathode stabilizer to be an annular ring having a rounded interior surface. In implementations, the turbo fan may have a pressure ratio of less than about 1.5 to 1.1.

In various alternative aspects, the first laser light receiving tube and the second laser light receiving tube may be glass and further the first spiral nozzle and the second spiral nozzle may be ceramic. Also, in some implementations, the turbo fan may have a first gas flow exit sending the lasing gas to the first anode vessel and a second gas flow exit sending the lasing gas to the second anode vessel.

In other implementations, the present implementations may include a multi-pass coaxial gas laser which has an anode vessel and a cathode vessel, the cathode vessel positioned downstream of the anode vessel, as well as a gas feed line extending from a turbo fan to the anode vessel. The laser may implement a return gas feed line connecting the cathode vessel to the turbo fan and include at least two plasma channels extending from the anode vessel to the cathode vessel, the at least two plasma channels substantially parallel to one another and each of the respective plasma channels having a lasing gas flow entrance, each of the plasma channels lasing gas flow entrance having a spiral gas flow nozzle adjacent to an anode and having a narrowed section downstream of the spiral gas flow nozzle. Each of the anodes in the at least two plasma channels may be connected to a separate DC power supply and further may include the cathode vessel positioning a cathode downstream of a lasing gas flow exit for each of the at least two plasma channels. In implementations, the return gas feed line may connect the cathode vessel to the turbo pump and may include a heat exchanger. The anode vessel may incorporate a laser light reflecting mirror initiating laser light reflection into the resonator chamber and allowing a laser light to reflect through the anode vessel and into one of the at least two plasma channels and may also include a laser light exit window allowing the laser light to exit the anode vessel. Internally within the laser may be included at least a first and a second angled mirror positioned within the cathode vessel wherein each of the plasma channels lasing gas flow entrances include a glass tube for receiving the laser light and are positioned within the anode vessel. In aspects and various implementations, the cathode vessel may have a first glass tube positioned downstream of the lasing gas flow exit for receiving laser light from a first of the at least two plasma channels and a second glass tube positioned downstream of the lasing gas flow exit of a second plasma channel for receiving laser light being transmitted to the second plasma channel.

In additionally or alternatively, the laser may include a connecting glass between the first glass tube and the second glass tube to allow the optical beam to be transferred from a first pair of plasma channels to an adjacent pair of plasma channels.

In some embodiments, the present description sets forth a multi-pass coaxial gas laser having a first and a second anode vessel with a cathode vessel, the cathode vessel positioned downstream of the first anode vessel and the second anode vessel and positioned therebetween. The gas laser may have a first gas feed line extending from a turbo fan to the first anode vessel, a second gas feed line extending from the turbo fan to the second anode vessel and a return gas feed line connecting the cathode vessel to the turbo fan. The gas laser defines an open plasma channel extending from the first anode vessel to the cathode vessel and to the second anode vessel. The open plasma channel forms an optical resonator and having a first and a second lasing gas flow entrance, wherein each of the lasing gas flow entrance has a plurality of spiral gas flow nozzles adjacent to an anode and having a narrowed section downstream of the spiral gas flow nozzles, the anode in the plasma channel connected to a high voltage DC power supply, The cathode vessel positions a cathode downstream of a lasing gas flow exit. In further aspects, the return gas feed line connects the cathode vessel to the turbo fan and having a heat exchanger. The resonator has a small convex reflector in the first anode vessel, a singular spherical concave rear reflecting mirror in the second anode vessel opposing the small convex reflector allowing an optical beam to reflect in the optical resonator, a convex reflector in optical opposition to the spherical concave rear reflecting mirror, an optical beam output coupler allowing the optical beam to exit the first anode vessel, and a planar output coupler in optical alignment with the convex reflector to output a ring shaped laser beam.

It should be appreciated that all combinations of the foregoing concepts and additional concepts described in greater detail herein are contemplated as being part of the subject matter disclosed herein. For example, all combinations of claimed subject matter appearing at the end of this disclosure are contemplated as being part of the subject matter disclosed herein.

DETAILED DESCRIPTION

Figure 2:
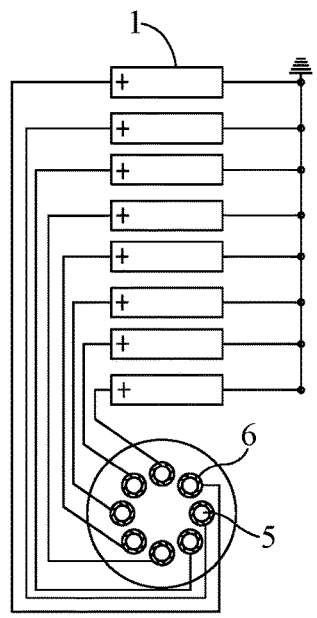
FIG. 2 illustrates an example of a configuration for a multi-pass coaxial gas laser.

Closed system coaxial gas flow lasers may exhibit significant efficiency increases by increasing the surface area exposure of the optical beam to the lasing plasma gas. Further, maintaining stable gas flow within the optical resonator and concurrent with the plasma activity of the gas contributes to significantly higher efficiency, stability and power of the optical beam. Thus, providing a relatively short distance of the excited gas medium within a gas flow allows for the optical beam to maximize exposure to the excited plasma gas while also creating a more efficient utilization overall gas flow.

In implementations, such maximization of gas flow and efficient utilization of the lasing gas plasma may be accomplished by centralizing gas from an open gas flow anode vessel to a cathode vessel and recirculating the lasing gas between the two at necessary high speeds. The optical resonator may then extend from a short controlled distance from the anode vessel to the cathode vessel thereby maximizing gas flow of the lasing gas after excitation and plasma formation. Additionally, the optical resonator may be lengthened by adding a second anode vessel opposite the first anode vessel, allowing the cathode vessel to receiving lasing gas from both the first anode vessel and the second anode vessel and doubling the size of the optical resonator. For example, a first anode vessel and a second anode vessel may be utilized with an interposing cathode vessel for gas recirculation from the turbo fan, to each of the anode vessels and then to the cathode vessel for gas recycling. In implementations, individual plasma channels can be formed to receiving the excited lasing gas wherein each enclosed plasma channel has a corresponding anode connected to an individual power supply while the gas flow into each plasma channel is controlled at the entrance of the plasma channel by a nozzle or other air flow moderation device.

The optical resonator for the multi-pass gas laser can utilize highly excited plasma lasing gas in alternative forms. In some implementations, the optical resonator/plasma tubes can extend in both a downstream gas flow direction (e.g. wherein the gas is flowing from a first anode vessel to the cathode vessel) and in an upstream direction (e.g. wherein the gas is flowing from the second anode vessel to the cathode vessel) when the optical beam is advancing from the first anode vessel to the second anode vessel. Additional excitation of the optical beam is accomplished by redirecting beam into the opposing direction, wherein the optical resonator extends from the second anode vessel, through the cathode vessel and to the first anode vessel. Formation of the optical resonator by forming such plasma channel pairs allows the optical beam to utilize highly energized plasma during the turbulent gas flow of the lasing gas to improve plasma uniformity. Such symmetrical laser gas flow design may increase the overall electrical efficiency of the laser and also the power of the output optical beam upon multiple passes through the optical resonator.

In alternative implementations, the optical resonator may extend from the anode vessel to the cathode vessel and the lasing gas may be recirculated in a closed loop system between the two vessels. The optical resonator in such implementations may extend from the anode vessel to the cathode vessel with a plurality of plasma channels formed in between, the individual plasma channels having an entrance at the anode gas flow exit. The plasma channels, as with various other implementations, may have at their entrance both a nozzle and an anode. For example, in implementations, the individual entrance of the plasma channels in various designs may include a spiral nozzle preceding the anode where the gas is energized thereby causing turbulence of the energized gas to flow between the anode vessel and the cathode vessel. In such implementations, the energy of the optical beam may be amplified by multiple passages through the optical resonator formed by the plasma channels.

Further, while it can be understood that plasma channel pairs disclosed herein that form a single passage of the optical resonator necessarily need to be in substantially close coaxial alignment in order for the optical beam to extend through the plurality of plasma channels, adjacent plasma channel pairs or adjacent singular plasma channels which form the return path of the optical resonator do not necessarily have to be substantially parallel, For example, a first plasma channel pair which extends from a first anode vessel, cathode vessel and second anode vessel would necessarily provide for substantially coaxial alignment in order to maximize as much as possible the centerline usage of the plasma channel downstream of the respective anode. However, adjacent and return optical resonator on which the optical beam takes a return path from the second anode vessel to the first anode vessel through the cathode vessel does not need to have a coaxial axis of the plasma channel that is directly parallel to the first optical resonator coaxial axis. For example, it may be necessary due to design constraints to slightly angle the return coaxial axis of the plasma channel pair off by a predetermined offset.

Efficient utilization of the plasma formed downstream of the anodes may be achieved by providing gas flow in the various constructions described herein. This includes providing gas flow from a turbo fan directly to a first and a second anode vessel and flowing the exited lasing gas from both anode vessels to a cathode vessel wherein the gas is recirculated into the system. The optical resonator may then be formed between both the anode vessels and the cathode vessels in either a singular or a plurality of individual plasma channels. Alternatively, a single anode vessel may be utilized in asymmetrical form wherein gas flows from the anode vessel to the cathode vessel for recirculation into the closed loop system, the either singular or plurality of plasma channels being formed between the single anode vessel and cathode vessel.

Figure 1:
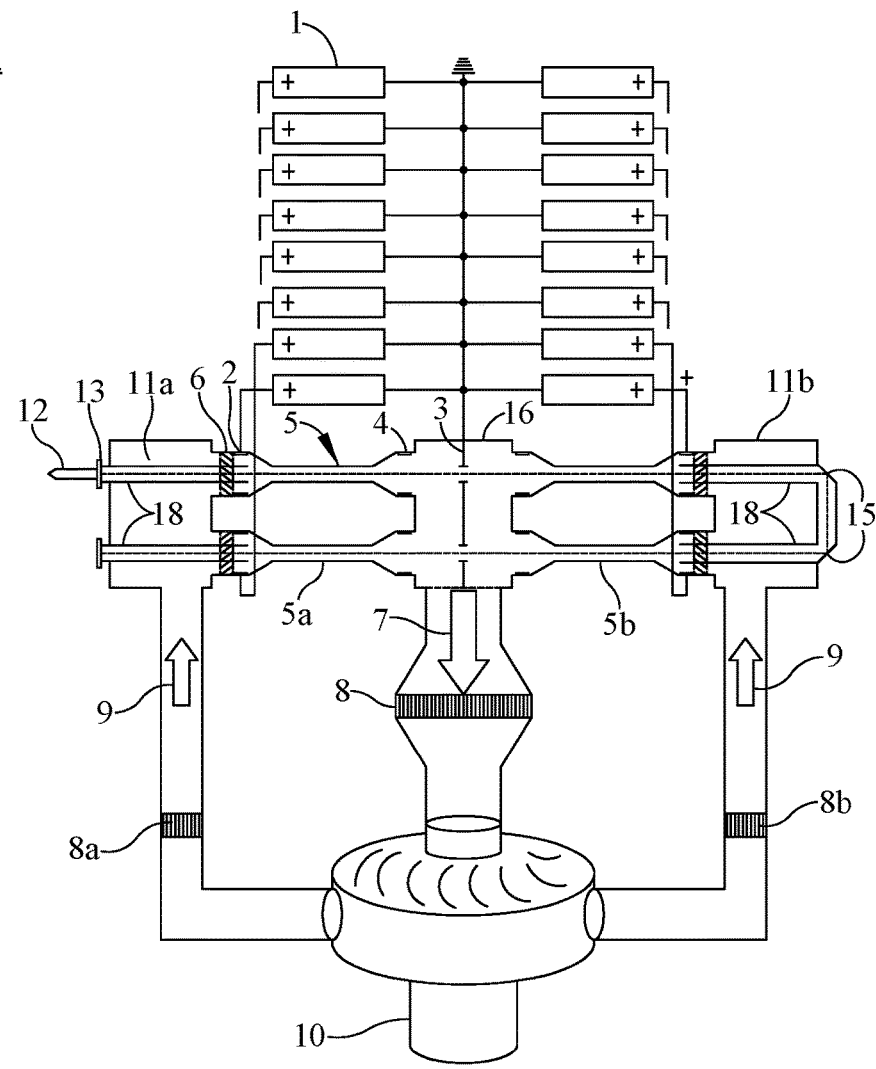
FIG. 1 illustrates an example of a multi-pass coaxial gas laser.

FIGS. 1 and 2 illustrate an implementation of a coaxial gas flow laser. A lasing gas may be provided for recirculation within the closed loops system. Anode vessel 11 may receive gas flow from the turbo fan 10 through gas supply line 9. The system may be either a symmetrical or an asymmetrical construction. For example, in a symmetrical coaxial gas flow laser, a first anode vessel 11a and a second anode vessel 11b may be utilized to receive gas flow from gas flow supply line 9. Lasing gas flow medium may be provided via turbo fan 10 at a high speed and pressure. Both first anode vessel 11a and second anode vessel 11b evenly distribute the gas medium into a plurality of plasma channels 5. The plasma channels provide an area within which the optical beam may excite as a result of transfer of energy from the gas flow to the optical beam. A plurality of plasma channels 5 are provided extending between either first anode vessel 11a and cathode vessel 16 and/or second anode vessel 11b and cathode vessel 16 to form the optical resonator. Plasma channels 5a of the first anode vessel 11a are co-axially aligned with the plasma channels 5b of the second anode vessel 11b in order to increase the total area of exposure of the lasing gas within the optical resonator.

Anode vessel 11a and 11b may receive the gas flow via gas supply line 9 and allow the lasing gas medium to flow through the plurality of plasma channels 5. Plasma channels 5 receives excited and gas flow from the anode vessel 11a, 11b. Such excited gas flow may be variously implemented using anodes and gas flow modifier. For example, in implementations, gas flow modifier may be a gas flow spiral nozzle 6 positioned along each entry or inlet into individual plasma channels 5. Inbound from the nozzle 6 towards the narrowed portion of the plasma channel may be positioned the anode 2 for that plasma channel. Gas flow spiral nozzle 6 imposes a turbulent gas flow on the gas medium as it is energized by the anode 2 thereby providing a highly efficient transfer of excitation of the optical beam as the optical beam 12 traverses the plurality of plasma channels 5. Utilization of spiral nozzles allows diameters of up to 20 cm while still maintaining flow. The gas flow within the plasma channels may be semi-laminar, laminar and optionally may be turbulent, or optionally in between both turbulent and laminar flow, depending upon multiple characteristics such as gas flow speed, absolute pressure of the laser gas, nozzle design, cross-sectional width of the flow channels, among other factors. The turbulence may help to create a more uniform plasma distribution into the larger volume of the plasma channel and resonator while the spiral nozzles, disclosed herein, may aid to create spiral flow within the plasma channels to create spiral flow of the gas and increase turbulence, as needed.

A plurality of plasma channels 5 may extend from the anode vessels 11a, 11b to the cathode vessel 16. The lasing gas medium is evenly distributed to each of the plasma channels extending between the respective anode vessel 11a, 11b and the cathode vessel 16. The plasma channels 5 may be substantially parallel to one another and form plasma channel pairs 5a, 5b which are coaxially aligned. For example, plasma channel pairs 5a, 5b may form a portion of the optical resonator. Plasma channel pairs, as depicted in FIG. 1, are formed from the combination of the parallel coaxial plasma channels formed from the first anode vessel 11a to the cathode vessel 16 and the associated parallel and coaxial plasma channel 5 extending from the second plasma vessel 11b to the cathode vessel 16.

Figure 3:
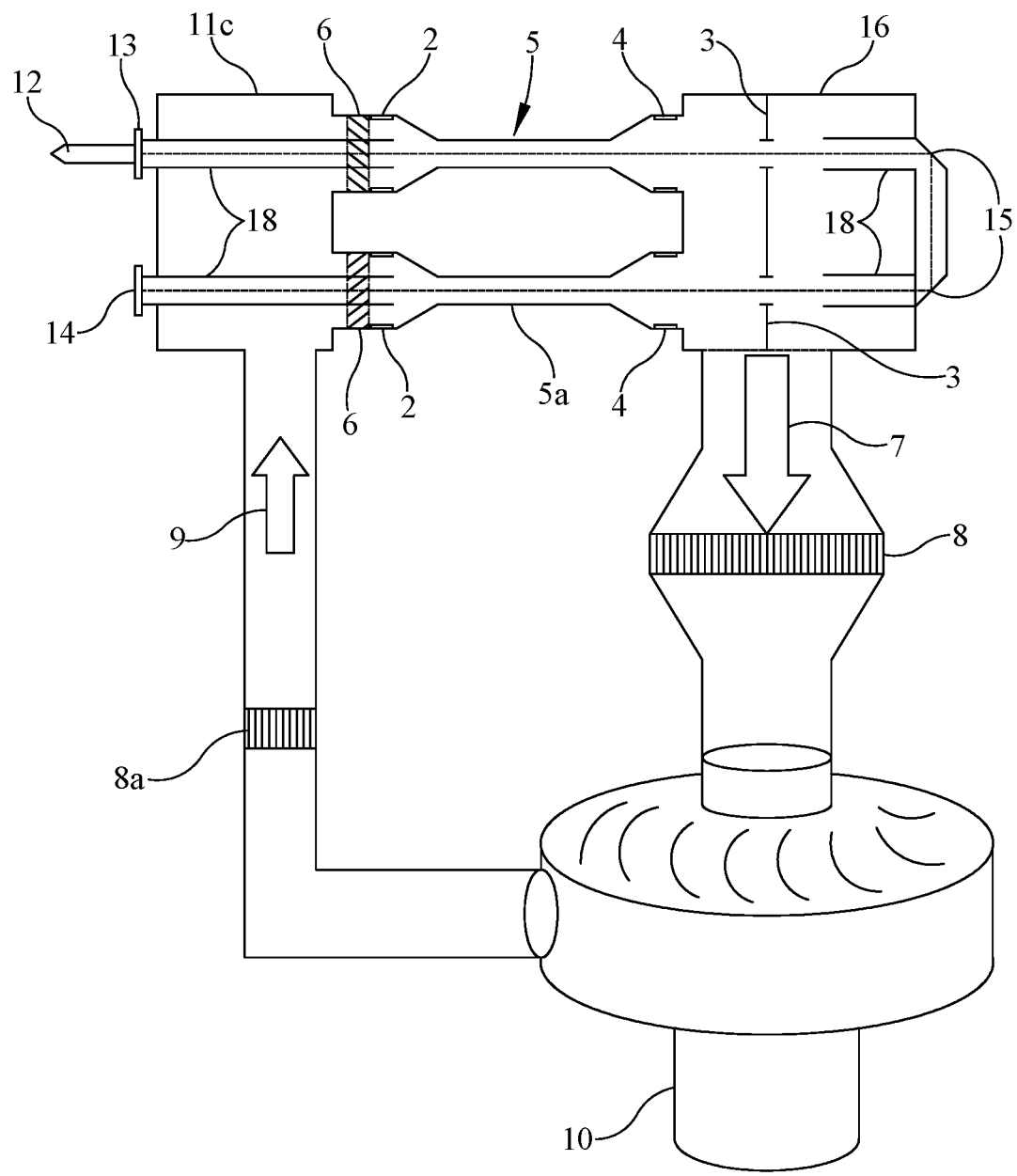
FIG. 3 illustrates another example of a multi-pass coaxial gas laser.

In variations, a coaxial or alternatively a flat configuration embodiment of the gas flow laser may utilize modular plasma channels as are depicted in the embodiments and figures. The modular plasma channels may be in a symmetrical configuration or in an asymmetrical configuration. For example, a modular plasma channel is depicted as a plasma channel pair shown as co-axially aligned channels 5 depicted in, for example FIG. 1. For example, the plasma channel which leads from anode vessel 11a forms the first plasma channel of the pair and the opposing plasma channel that leads from the anode vessel 11b to the cathode vessel forms the second plasma channel of the plasma channel pair. Also, for example, an alternative modular plasma channel is shown in FIG. 3. For example, a modular plasma channel can consist of the plasma channel extending from the anode vessel 11c to the cathode vessel 16 in the asymmetrical configuration shown.

Optical beam 12 may self-initiate in an anode vessel 11a, 11b from the lasing gas and resonate through the optical resonator formed by the plurality of plasma channel 5 pairs. Anode vessel 11a, 11b may be retained under a vacuum and receive the lasing gas flow medium from the turbo fan 10. The optical beam 12 originates as a result of the excitation of the lasing gas within the optical resonator chambers which are formed by the combination of structures of the anode and cathode vessels along with the plasma channels. Optical beam 12 may be redirected by the mirrors 15 and rear mirror 14 and enter into an anode vessel 11a or 11b and into a respectively aligned plasma channel and to the cathode vessel. For example, first anode vessel 11a has an optical rear reflecting mirror 14 for resonating and reflecting lasing gas generated optical beam 12. The rear optical mirror 14 may be nearly 100% reflective to appropriately reflect and redirect the generated lasing light back through the optical resonator. The optical mirror reflector may be positioned within the initiating anode be appropriately aligned to redirect optical beam back through the optical resonator thereby ensuring resonating activity by the lasing light. Optical beam 12 then passes through the substantially parallel plasma channel pairs and is reflected by angled plane mirrors 15 to a correspondingly adjacent plasma channel pair for redirection. For example, the redirection by the angled mirror allows the optical beam to be reflected from the second anode vessel to the cathode vessel 16 and then to the first anode vessel 11a and exit the first anode vessel 11a via optical beam output coupler 13 or output coupler which has a partial reflectivity of about 60%. Hence, the optical beam output coupler 13 may be formed of an output mirror which partially reflects light and partially allows light to pass there through. The example depicted is for explanatory purposes only and any number of angled plane mirrors and combinations of optical resonator plasma channel pairs may be implemented. For example, as depicted in FIG. 2, eight plasma channel pairs are formed and the optical resonator is formed from the combination of the plurality of plasma channels utilized while the optical beam is redirected through the plasma formation areas of the coaxial gas laser.

Figure 8A:
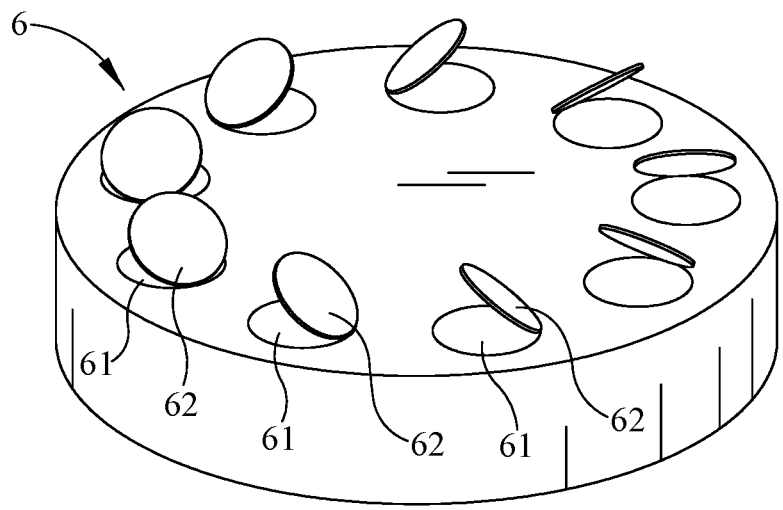
FIG. 8A is a top view of a nozzle for use in the multi-pass coaxial gas laser.
Figure 8B:
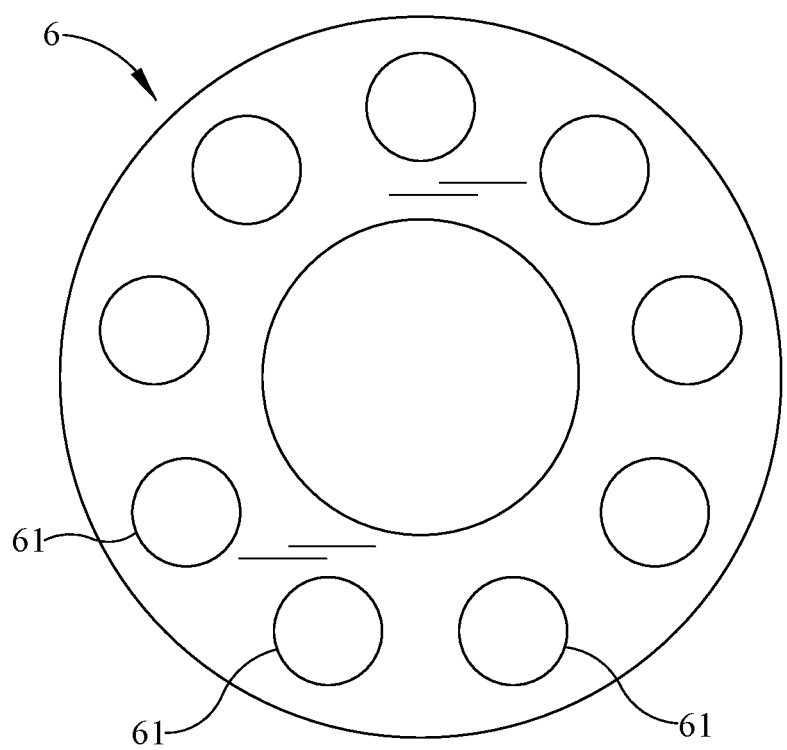
FIG. 8B is a perspective view of a nozzle for use in the multi-pass coaxial gas laser.

Gas flow may be controlled within the plurality of plasma channels through utilization of nozzles 6. For example, nozzles 6 may be positioned at the entry of each of the plasma channels 5 to induce turbulent gas flow within the individual plasma channels 5 and to the cathode vessel 16 in order to increase plasma uniformity. Nozzles 6 may induce turbulent flow with gas flow redirection. For example, nozzles 6 may be spiral gas flow nozzles causing the gas flow to spiral around an axial centerline of the annular plasma channel 5. A number of airflow control mechanisms may be utilized for control of the flow and maintenance of the turbulent flow. For example, gas flow nozzles 6, as depicted in FIGS. 8A and 8B, may have a plurality apertures 61 and deflectors 62 formed therein to control the direction and rotation of the gas flow. The nozzle can be from a variety of dielectric materials such as, for example, pyrex, quartz or ceramic, among some options. For example, the nozzle may be constructed from ceramic, plastic or other known insulators or combinations thereof.

At the entry of each of the plurality of plasma channels may be positioned an anode ring 2. Anodes 2 may each be connected to a power supply 1 in order to excite the lasing gas and create the plasma for excitation of the optical beam 12. Anodes 6 are positioned at an individual exit of a plurality of gas flow exits of the anode vessel. For example, the anodes may be positioned just before a volumetrically narrowed portion of the gas flow area, such as, for example, the plasma channels 5. Anodes 6 may be designed to have minimal gas flow disturbance impact on the lasing gas as it passes by the individual anodes. For example, the anodes may individually be annular rings of stainless steel or other metal or alloy extending commensurate with the annular surface of the gas flow exit of the anode vessel. Alternatively, anodes may be repositioned as necessary depending on gas flow and plasma requirements. For example, anode annular rings or anode plates may be positioned in alternative positions such as at the entry of each of the plurality of plasma channels 5. Any combination of anode designs and positions may be implemented to achieve appropriate plasma activity within the plasma channel.

As depicted in FIG. 1, each of the anode rings 2 may be connected to an individual power supply 1 to maintain a smaller control and footprint for the lower power requirements of the single connected anode 2. For example, a high voltage DC power supply 1 may be utilized such as a 20 kV DC supply with a current of about 40-60 mA and at about 1 kW. Such a configuration of a plurality of power supplies 1 may result in a plasma efficiency of about 90%.

As shown in FIG. 2, the plurality of plasma channels 5 may be oriented annularly around a periphery of the flow path from the anode vessels 11a, 11b to the cathode vessel 16. For example, eight plasma channel pairs with sixteen plasma channels 5 and sixteen individual power supplies 1 may provide sufficient plasma excitation to generate adequate lasing activity. For example, depending on the gas being utilized, such as a combination of $CO_2$, $N_2$ and He, the output power from each of the plasma channel tube pairs can range from 100 W up to about 300 W.

Downstream of the plasma channels 5 is a cathode vessel 16 which positions a common cathode 3 within the cathode vessel and which is in the gas flow path between the plasma channels. Gas flow stabilization within the cathode vessel 16 may be achieved using a gas flow mechanical stabilizer. For example, an optional cathode stabilizer 4 may be positioned at the gas flow exit of each of the plasma channels and the corresponding entrance to the cathode vessel 16 in order to improve the uniformity of the generated plasma. Cathode stabilizer may be an annular stainless steel, alloy or other metal rounded ring which is placed at the outlet of the channel 5.

Within the anode vessel 11a, 11b are positioned glass tubes 18 to contain and separate the excited optical beam from the circulating gas within the anode vessel 11a, 11b. Glass tubes 18 may be formed of pyrex, quartz, ceramic or other material to insulate the optical beam and mirrors from direct gas flow, dust and other features of the turbulent gas flow within the anode vessels 11a, 11b. Glass tubes 18 may be provided from one wall of the vessel to the opposing wall of the vessel leading into the plasma tubes 5. For example, as depicted in FIG. 1, glass tubes 18 may extend from the nozzle 6 to the angled mirror 15. A continuing matching glass tube may also connect the angled mirrors between adjacent resonator pairs to similarly both protect mirrors 15 from the gas flow and prevent dust adhesion thereon but also to provide an undisturbed optical beam path between angled mirrors 15 within the anode vessels 11a and 11b. For example, the gas flow may not directly impact the angled mirrors but may pass around the individual glass tubes 18 which are provided to isolate the optics and the lasing optical beam from chosen areas of direct gas flow. The angled mirrors 15 may be isolated from gas flow and from direct contact from the disturbed gas flow and recirculated gas flow and therefore keep them clean. For example, angled mirrors 15 may be positioned inside of a bugger area formed by tubes 18. As a result, mirrors 15 may remain clean from dust and other contaminates within the gas flow. Mirrors 15 may be heated from laser emission absorption and from other sources as may be required.

Beneficially, by separating the angled mirrors 15 from direct exposure to the gas flow and turbulent gas within the vessels 11a, 11b, the mirrors will not require routine maintenance and cleaning and thus increase further the efficiency of the laser design and maximize the output power of the optical beam.

Angled mirrors 15 may redirect the optical beam 12 from one plasma channel pair to an adjacent plasma channel pair. As depicted in FIG. 2, eight plasma channel pairs may be combined. Mirrors 15 may redirect the optical beam to the next adjacent plasma channel pairs from either the first anode vessel and/or the second anode vessel, as required to continue resonating the optical beam through the plasma channels. For example, when implemented in an annular constructed as shown in FIG. 2, the next adjacent plasma channel pair may be slightly rotationally angled below the current plasma channel pair as the optical beam advances around the optical resonator in a rotational/annular fashion. Thus angled plane mirror 15 will accommodate redirection not only on the same plane but into a secondary plane where the next adjacent plasma channel pair is positioned within the coaxial gas flow laser.

Downstream of the cathode vessel is the gas return line 7 which may also include a heat exchanger to reduce the heat and or modify the characteristics of the gas flow. The heat exchanger and turbo fan 10 may be utilized and/or combined in order to provide high speed and high pressure gas flow to the plasma tubes 5. For example, a gas flow speed at the tubes may be about 0.2 to about 1M (about 150 to about 500 m/s), a pressure within the tubes of about 70 to about 100 tor and with a pressure ratio of about 1.1-1.5. Due to the reduced path flow of the lasing gas media and the gas flow, a turbo fan of about 1.5 kW may be utilized. As well, secondary heat exchangers 8a, 8b may be included into the gas flow supply line 9 downstream of the turbo fan 10 in the area of the gas supply line. Positioning of the secondary heat exchangers 8a, 8b can optionally be used to reduce the gas temperatures after the turbo fan.

Various proportions of lasing gas flow medium may be utilized. For example in some situations, a gas flow medium having about 3 to about 25% CO2, about 40 to about 80% N2 with Helium making up the balance may be utilized. Further, CO2 may be utilized as the oscillator for laser emissions of about 10.6, 9.8 and 9.2 micron wave length. Alternative isotopes may be utilized such as in the following table.

| Carbon atom isotope | First oxygen atom isotope | Second oxygen atom isotope | Wavelength (μm) |
|---|---|---|---|
| $^{14}C$ | $^{16}O$ | $^{16}O$ | 9.8-10.2 |
| $^{13}C$ | $^{16}O$ | $^{16}O$ | 9.5-9.8 |
| $^{12}C$ | $^{16}O$ | $^{16}O$ | 9.1-9.3 |
| $^{12}C$ | $^{16}O$ | $^{18}O$ | 9.0-9.2 |
| $^{13}C$ | $^{16}O$ | $^{18}O$ | 9.5-9.8 |
| $^{12}C$ | $^{17}O$ | $^{17}O$ | 9.0-9.3 |
| $^{12}C$ | $^{18}O$ | $^{18}O$ | 9.0-9.2 |
| $^{13}C$ | $^{18}O$ | $^{18}O$ | 9.4-9.8 |
| $^{14}C$ | $^{18}O$ | $^{18}O$ | 9.9-10.2 |

In some implementations, the laser implemented by the present designs may have an output power PL=1000 W and will require about 4000-4500 W of electrical power for the DC power supply and about 500 W for the turbo fan 10. The associated wall plug efficiency will accordingly be about E0-20-25% depending on the mode of the output optical beam. Efficiencies noted herein result in higher overall cross sections of the gas flow through all tube pairs or through the single wider larger diameter resonator chamber depicted in FIG. 3. As a result of the utilization in higher cross sectional area of the gas flow, the energy consumption of the high speed turbo blower 10 depicted can be comparatively lower and the overall efficiency of the laser can be high. For example, the electro-optical efficiency of the laser itself may be about 25%-30% and factoring in the energy costs of the turbo blower the efficiency can drop to 20%-25%.

These and other variations are contemplated herein. Similar constructions recited herein may be used in combination, omitted or replaced with other disclosed structures. For example, an asymmetrical variation of the coaxial multipass laser is shown in FIG. 3. In such implementation, an anode vessel 11c is utilized which receives lasing gas from the turbo pump 10 from gas supply line 9. Anode vessel 11c receives the lasing gas and provides it through the plasma channels in a single direction towards the cathode vessel 16 through a plurality of plasma channels. The plasma channels need not be in an annular configuration as previously described. For example, the plasma channels may be positioned in multiple planes, in a single plane or rotationally/annularly as previously disclosed.

Figures 4A, 4B:
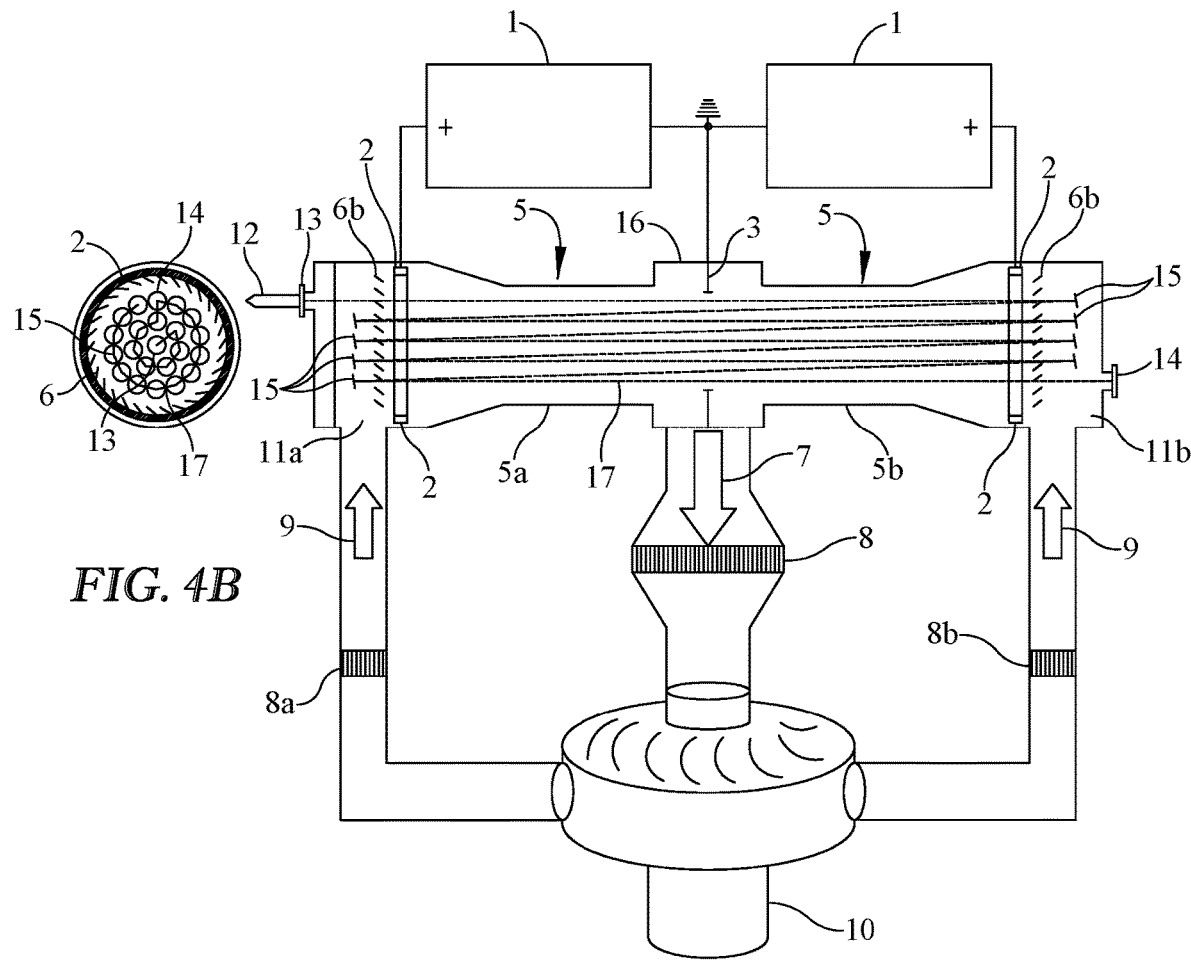
FIG. 4A is an additional example of a single module multi-pass coaxial gas laser.
FIG. 4B is a sectional view of the configuration for the optical resonator positioning for the multi-pass coaxial gas laser of FIG. 4A.

As well, the plasma channels can be positioned within the lasing gas flow space to take full advantage of the surface area of the lasing gas. Namely, a plurality of individual plasma channels may fill the void formed by the annular cross section of the laser housing and gas flow path to form the optical resonator. For example, the optical resonator cross section can appear and be organized as depicted in FIG. 2 wherein each of the plasma channel pairs or each module is positioned radially around a central axis. Also, a plurality of plasma channels may fill the entire void formed by the annular cross section of the single module laser housing and gas flow path cross sectional area, as depicted in FIG. 4B. In such embodiment, a cross sectional of which is depicted in FIG. 4A, individual plasma channels are not formed but the optical resonator encompasses the entire cross sectional area of the flow path as shown. Hence the plasma channel is formed by the linear expanse of the distance between mirrors as the laser traverses the optical resonator from anode vessel 11a, to cathode vessel then to anode vessel 11b. Thus, instead of the plurality of modules depicted in other examples, a single module forming first and second anode vessels is used with a plurality of reflective mirrors and an output coupler.

As depicted in FIG. 3, anode vessel is connected to the cathode vessel via a plurality of plasma channels or tubes 5. The plurality of plasma channels and/or optical resonator passages may have a similar construction as outlined previously. For example, optical beam rear reflecting mirror 14 formed in the wall of the anode vessel reflects and redirects the optical beam 12 back into the optical resonator/glass tubes. Glass tubes 18 may be provided to enclose and protect optical beam 12 and mirrors 15 at selected and chosen locations while in the anode vessel and/or in the cathode vessel, as optionally presented. At the exit of the anode vessel and leading into the plasma channel is positioned a nozzle 6 followed by the anode 2 just before the narrowed section of the plasma channel. Other variations of the upstream plasma generation and anode constructions may be optionally included in place of or in addition to various structures set forth. For example, the anode 2 may include an annular anode ring or may be anode plates periodically spaced around the entry of the plasma channel. As well, exact positioning of the anode and of the nozzle may be relocated based upon specific aspects of any such implementation. For example, as utilized in this or in the other embodiments, nozzle 6 may be positioned at various locations. For example, nozzle 6 may be located just upstream, as related to gas flow, from the anode 2. Optionally, nozzle 6 may excluded or combined. For example, the nozzle 6 may be combined at the same location and structure as the anode. Alternatively, the nozzle may positioned downstream from the anode and prior to the entrance of the narrowed portion of the plasma channel 5. For example, nozzle 6 may be positioned at locations adjacent to the entry of the plasma channel 5 for better control of turbulent flow of the lasing gas. In variations, a nozzle may be omitted or spiral flow of the gas may be imparted by virtue of the various passage walls through which the gas travels.

Downstream of the anode and leading towards the cathode vessel are located the plasma channels in which transfer of energy and excitation of the optical beam may take place. Upon exiting of the plasma channel and at widening section of the gas flow path, a cathode stabilizer optionally may be included as previously as needed. For example, a cathode stabilizer stainless steel ring may substantially surround the inlet to the cathode vessel in order to stabilize the airflow prior to passing through the cathode elements 3.

Additionally, or alternatively, glass tubes 18 may optionally be located within the cathode vessel 16 to receive the optical beam 12 from the plasma channel protect and isolate the optical beam 12 from the turbulent gas flow within the vessel. Similar construction of the glass or Pyrex tubes 18 as previously described may be incorporated with buffer zones around angled mirrors 15 to protect the mirrors from dust and other turbulent gas flow characteristics. Return path optical resonator which redirects the optical beam upstream of the charged lasing gas occurs as the optical beam 12 travels from the cathode vessel 16 to the anode vessel 11c via the plasma channel connecting the two vessels.

The asymmetrical implementation of the multi-pass coaxial gas flow laser realize similar increased efficiencies and smaller footprint of the laser by increasing the exposure area of the optical beam with the lasing gas and particular the plasma formed downstream of the anodes. Further, in implementations, multiple passages of the optical beam through the plasma channel may be desirable. For example, multiple traverses, such as four or more traverses, of the optical beam through the plasma channel may maximize the efficiency of the lasing gas, plasma generation and power of the optical beam output.

Alternative constructions and elements may be included or replaced with additional features outlined herein. As shown in FIG. 4A and FIG. 4B, a symmetrical construction of a coaxial multi-pass laser is depicted wherein first and second anode vessels 11a, 11b are utilized with an interpositioned cathode vessel 16. A large open resonator cavity is thus formed internally allowing the laser to fully excite without the need of individual and isolated channels 5 noted above. In such implementation, the plurality of plasma channels positioned between the anode vessel and the cathode vessel is replaced with the singular co-linear plasma channel 5a and 5b. The co-linear plasma channel 5a and 5b may not be structurally constrained as channels 5 previously depicted and create an open optical resonator 17 through which the optical beam reflects in a Z-shaped pattern. Optical beam 12 continues reflection within the anode vessel 11b via rear optical beam reflecting mirror 14 and mirrors 15 and is directed through plasma channel 5b, through cathode vessel 16 and towards first anode vessel 5a. Continued resonance through the cavity forms a standing wave cavity resonator for light waves. Light confined in the cavity reflects multiple times producing standing waves for certain resonance frequencies. In the present embodiment, the resonator cavity allows resonance of the light waves within the excited gas without the need, in the present example, for plasma channels previously described as they are formed in the open resonator. Similar construction elements may be utilized as previously described.

For example, anode 2 may be implemented in either anode vessel 11a, 11b and a common cathode 3 may be positioned centrally within the cathode vessel through which the gas passes. Further, plurality of angled nozzles or air deflectors 6b may be utilized to create turbulent flow of the gas through the optical resonator and plasma channel. For example, a plurality of angled fins or gas deflectors may be positioned along the outer periphery of the anodes 11a, 11b to create a spiral flow of the gas through the plasma channel or to otherwise control the air flow characteristics of the lasing gas.

Further, in implementations, maximization of the optical resonator and plasma can be achieved though organization and redirection of the optical beam using the angled mirrors 15 in an outwardly expanding annular spiral. For example, as shown FIG. 4B, the optical beam may traverse the optical resonator twenty-two times before exiting through output coupler 13 formed in the side wall of the first anode 13. By expanding the redirection and reflection of the optical beam in such a manner, maximization of the surface area of the optical resonator is achieved. Alternative or additional positioning of the mirrors 15 to redirect the optical beam through the optical resonator in alternative configurations are possible. For example, partial spiral, flat or embedded circular traverses within the optical resonator may be accomplished.

Additional and/or alternative modifications may be implemented. For example, the power supply indicated in FIG. 4A may utilize a singular high voltage DC power supply providing electrical power to the individual plasma channels 5a and 5b. For example, a high voltage DC power supply may be provided to power the electrodes 2, one for each anode vessel 11a, 11b.

Figures 5A, 5B:
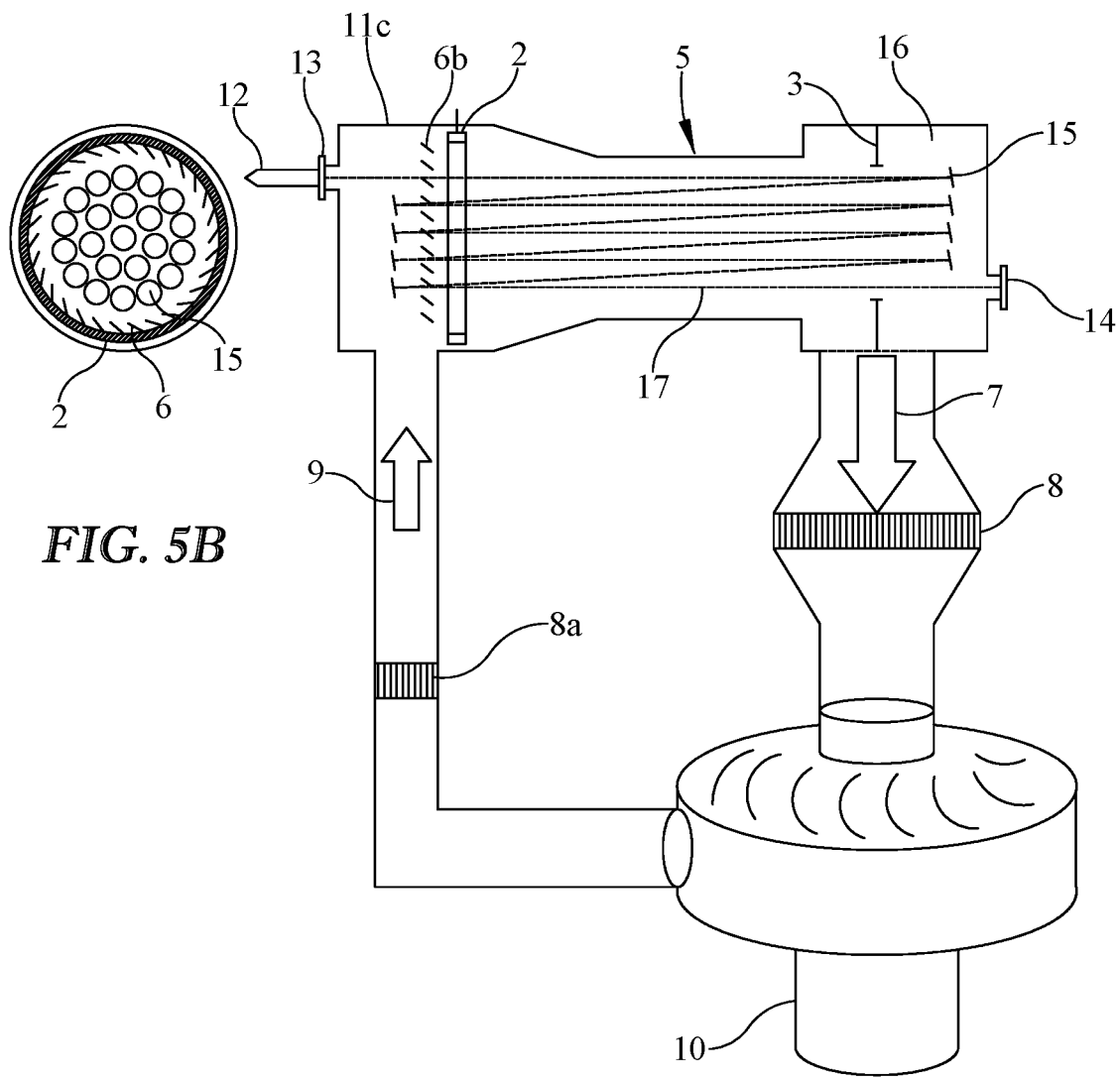
FIG. 5A is an additional example of an asymmetrical multi-pass coaxial gas laser.
FIG. 5B is a sectional view of the configuration for the optical resonator positioning for the multi-pass coaxial gas laser of FIG. 5A.

Alternative constructions and elements may be used in addition or in place of the various features outlined herein. For example, FIGS. 5A and 5B depict an asymmetrical configuration for a single wide optical resonator 17 formed within the plasma channel 5 through which the optical beam 12 resonates in Z-shaped form. Anode vessel 11c may be provided with plasma channel 5 extending between the anode vessel and the cathode vessel 16. Optical beam rear reflecting mirror 14 alongside wall of the cathode vessel 16 allows reflection of the optical beam back into the resonator chamber once the laser light is self-initiated by the lasing gas within the anode vessel. Gas flow modification structures may be positioned adjacent the entrance of the plasma channel 5 to produce a turbulent flow. For example, spiral nozzles or deflectors 6 may be utilized to produce spiral flow of the lasing gas through the plasma channel. Angled mirrors 15 provide a Z-shaped resonator between the cathode and the anode vessels. As depicted in FIG. 5B, embedded circular traverses of the optical beam are depicted wherein optical beam exposure to the plasma channel surface area is maximized. Cathode vessel 16 may provide a cathode 3 through which the energized gas must flow. An anode may be provided and positioned as needed. For example, anode 2 may be positioned just downstream of the gas flow deflectors. Multiple passages of the optical beam within the optical resonator may be supported and effective utilization of the plasma by virtue of the shortened pathway of the gas flow through the optical resonator.

Figure 6:
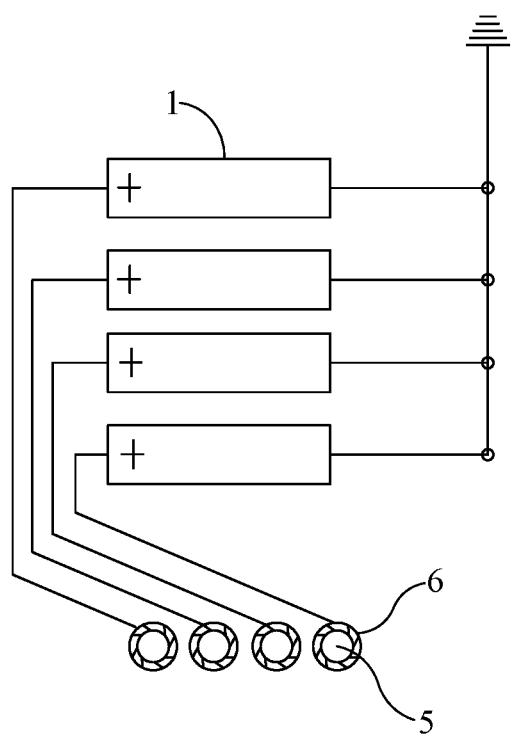
FIG. 6 is a power supply diagram and positioning for the anodes for a multi-pass flat design configuration for a gas laser.

In FIG. 6 a depiction flat design configuration and of the electrical connection for the flattened single plane positioning of an optical resonator which may be utilized. For example, as shown, four plasma channel pairs for both nozzles 6 and plasma channels are positioned side by side in a flat configuration. The anodes, not shown, are connected to individual DC power supplies 1. Various configurations apart for a flat configuration may be implemented. For example, stacked or diagonal configurations may be functional depending on the positioning and size of the necessary plasma channel and optical resonator. In such flat design and configuration, multiple pairs of plasma channels may be utilized. For example, anywhere from four to ten plasma channel pairs may be implemented depending on the desired power output, turbo fan speed, gas pressure and other considerations may dictated how many pairs are implemented. As well, multiple depicted configurations may be utilized in addition or in place of those disclosed.

Figure 7:
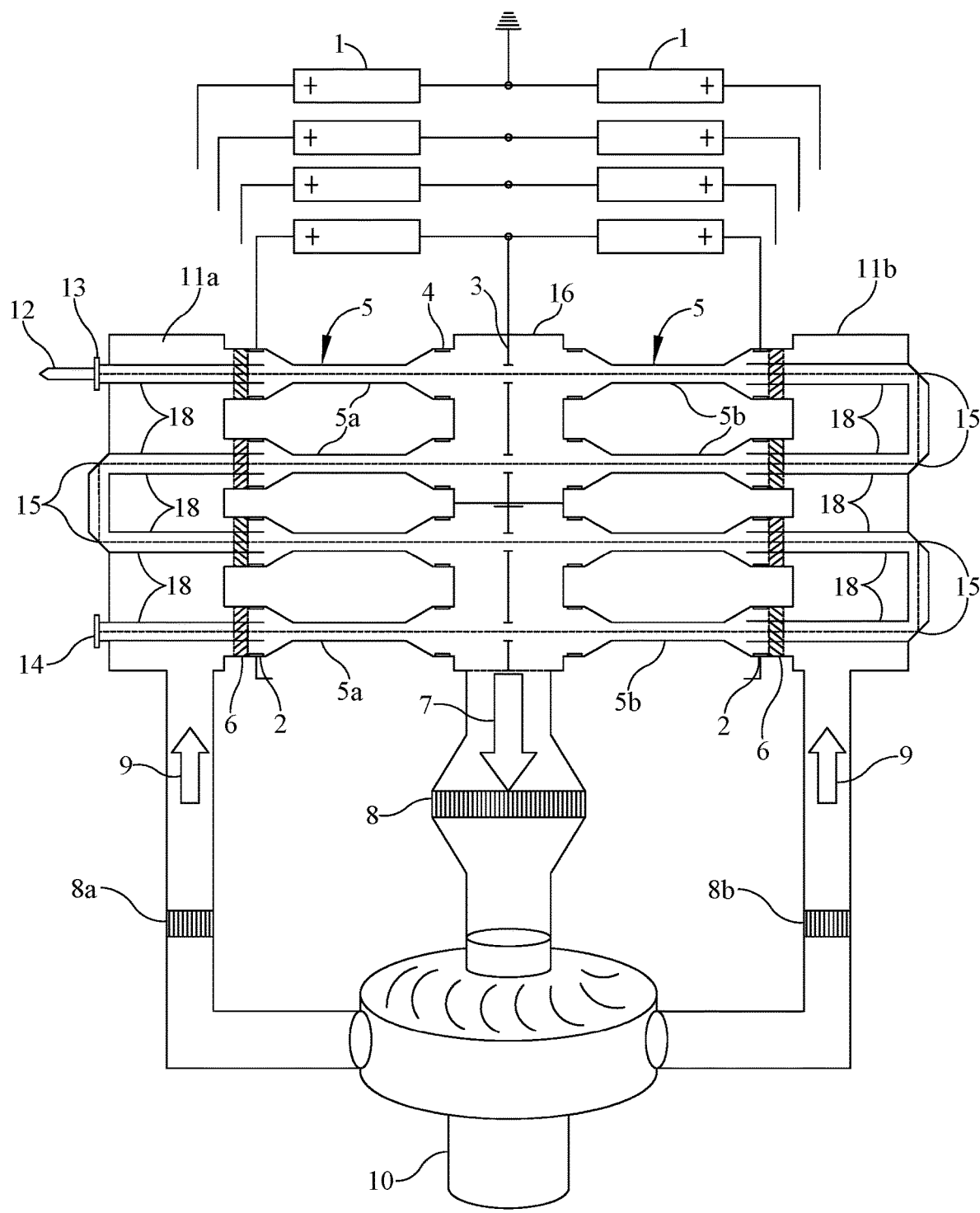
FIG. 7 illustrates an additional example for a multi-pass flat design configuration for a gas laser.

Alternative constructions and elements may be included or replaced with additional features outlined herein. FIG. 7 depicts a plurality of plasma channels in symmetrical configuration. For example, the plurality of plasma channels 5 may be positioned adjacent each other along a similar plain, as shown in FIG. 6, or in alternative configurations as described herein. High Voltage DC powers supply 1 is connected to individual anodes 2 within the first anode vessel 11a and the second anode vessel 11b. In some implementations, at least three plasma channels 5a in the first anode vessel 11a can be matched with at least three plasma channels 5b in the second anode vessel 11b. The co-linear plasma channels 5a, 5b in the first and the second anode vessel increase the volume of lasing gas within the optical resonator.

In variations disclosed herein, the number of plasma channels utilized is generally greater than or equal to 3 or 4 (N>=3 in some examples) which creates sufficient cross sectional area exposure to the lasing gas to support high energy excitation of the optical beam. The dimensionless length of each plasma tube/channel is generally quite low, for example $L=l/D<=10$ which results in the exhibited gas flow having minimal friction losses and uniformity within the plasma channels. Typical pressure ratios within the plasma channels is low, less than about 1.5. For example, lasers have an output power of 2 Kw need a turbo fan with an electrical draw of less than about 1.5 kW and a wall plug efficiency of up to 20-25%.

Figure 9A:
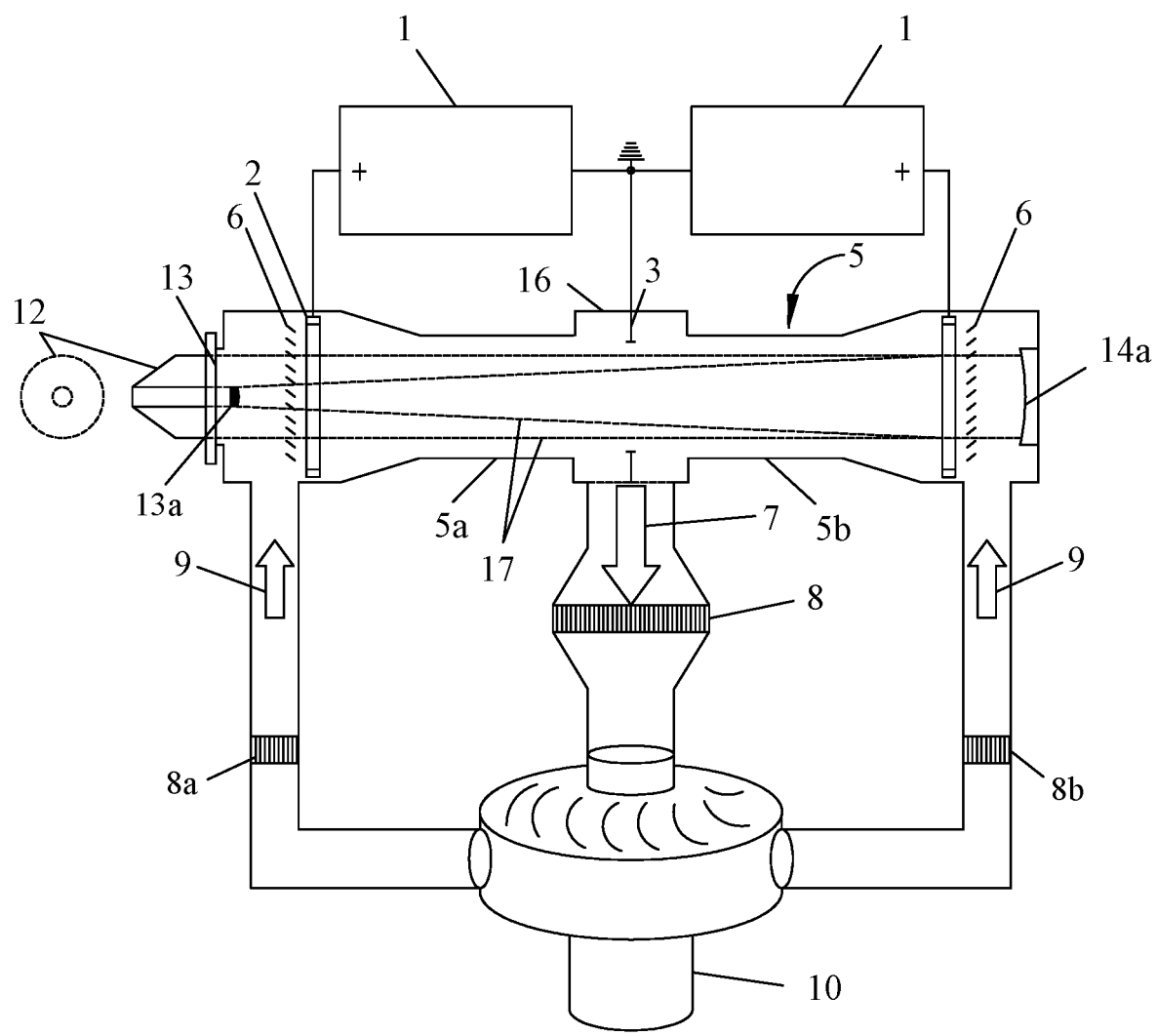
FIG. 9A is a further example of a multi-pass coaxial gas laser.
Figure 9B:
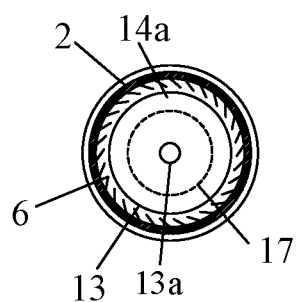
FIG. 9B is a sectional view of the configuration for the optical resonator positioning for the multi-pass coaxial gas laser of FIG. 9A.

Alternative constructions and elements may be included or replaced with additional features outlined herein. As shown in FIG. 9A and FIG. 9B, a symmetrical construction of a single laser module using a telescopic resonator with additional optical connection of an output coupler is disclosed. The system utilizes a coaxial multi-pass laser wherein first and second anode vessels 11a, 11b are utilized with an inter-positioned cathode vessel 16. In such implementation, the plurality of plasma channels positioned between the anode vessel and the cathode vessel are replaced with singular co-linear plasma channels 5a and 5b which are combined to form a singular discharge tube within a telescopic resonator. The co-linear plasma channels 5a and 5b may not be structurally constrained as channels 5 previously depicted and create an open optical resonator 17 through which the optical beam reflects in a Z-shaped pattern. Optical beam 12 continues reflection within the anode vessel 11b via rear concave optical beam reflecting mirror 14 and is directed through plasma channel 5b, through cathode vessel 16 and towards first anode vessel 5a. Similar construction elements may be utilized as previously described.

In the embodiment depicted in FIG. 9A, the symmetrical discharge tube 5a, 5b is utilized with a telescopic optical resonator with an additional optical connection. The resonator consists of only three mirrors, 13, 13a and 14. Rear mirror 14 may be a spherical concave reflector mirror which exhibits significantly high reflection nearing 100%. Output coupler mirror 13 may be a ZnSe partially transmissive mirror which is utilized to allow laser emission through the laser output. A small convex mirror is utilized for the selection and amplification of central mode TEM00 or TEM01 (Transvers Electromagnetic Mode) of the laser beam in order to output the beam with minimal divergence. A transverse mode of a beam of electromagnetic radiation is a particular electromagnetic field pattern of radiation measured in a plane perpendicular (i.e., transverse) to the propagation direction of the beam. Transverse modes occur in radio waves and microwaves confined to a waveguide, and also in light waves in an optical fiber and in a laser's optical resonator. The internal resonating laser 17 is shown within the resonator undergoing amplification due to the gas excitation.

As a result of the design of the resonator cavity 5a and 5b with the rear mirror 14 and concave mirror 13a, the laser output 12 shape is depicted as ring or donut shaped. The end view of FIG. 8A depicts the position of the mirrors 13, 13a and 14 as well as the air flow nozzles 6, internal laser position 17 and anode 2. Further, secondary heat exchangers 8a, 8b may be utilized in order to reduce the gas flow temperature, as needed to create adequate turbulent or semi-turbulent flow of the lasing gas.

While several implementations have been described and illustrated herein, a variety of other means and/or structures for performing the function and/or obtaining the results and/or one or more of the advantages described herein may be utilized, and each of such variations and/or modifications is deemed to be within the scope of the implementations described herein. More generally, all parameters, dimensions, materials, and configurations described herein are meant to be exemplary and that the actual parameters, dimensions, materials, and/or configurations will depend upon the specific application or applications for which the teachings is/are used. Those skilled in the art will recognize, or be able to ascertain using no more than routine experimentation, many equivalents to the specific implementations described herein. It is, therefore, to be understood that the foregoing implementations are presented by way of example only and that, within the scope of the appended claims and equivalents thereto, implementations may be practiced otherwise than as specifically described and claimed. Implementations of the present disclosure are directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the scope of the present disclosure and following claims.

What is claimed is:

1. A multi-pass coaxial gas laser, comprising:
a first anode vessel, a second anode vessel and a cathode vessel, the cathode vessel positioned between the first anode vessel and the second anode vessel;
a first gas feed line extending from a turbo pump to the first anode vessel;
a second gas feed line extending from the turbo pump to the second anode vessel;
a return gas feed line connecting the cathode vessel to the turbo pump;
a first open plasma channels extending from the first anode vessel to the cathode vessel, the first open plasma channel having a spiral gas flow nozzle adjacent to a first anode;
a second open plasma channels extending from the second anode vessel to the cathode vessel, the second open plasma channel having a spiral gas flow nozzle adjacent to a second anode;
each of the anodes having a DC power supply;
wherein the first open plasma channel extending from the first anode vessel to the cathode vessel has the respective co-linear second open plasma channel extending from the cathode vessel to the second anode vessel forming a plasma channel pair;
wherein the cathode vessel positions a cathode between the plasma channel pair;
the return gas feed line connecting the cathode vessel to the turbo pump having a heat exchanger;
an optical beam rear reflecting mirror reflecting an optical beam in the first anode vessel and into the open plasma channels extending from the first anode vessel to the cathode vessel to the second anode vessel;
an optical beam exit output coupler allowing the optical beam to exit the first anode vessel;
a plurality of angled mirrors positioned within the first anode vessel and at least one angled mirror in the second anode vessel to redirect the optical beam.

2. The multi-pass coaxial laser of claim 1 wherein each of the spiral gas flow nozzles have a plurality of apertures.

3. The multi-pass coaxial laser of claim 2 wherein each of the apertures for each of the spiral gas flow nozzles has an associated deflector and where in each of the deflectors is angled at about 45 degrees.

4. The multi-pass coaxial gas laser of claim 1 further including a heat exchanger upstream from the turbo pump.

5. The multi-pass coaxial gas laser of claim 1 wherein the at least one angled mirror in the second anode vessel is a concave optical beam rear reflecting mirror reflecting the optical beam into the open plasma channel, and an optical beam exit output coupler extending through the first anode vessel.

6. The multi-pass coaxial gas laser of claim 1 wherein the first power supply and the second power supply is a high voltage DC power supply.

7. The multi-pass coaxial gas laser of claim 1 wherein the turbo pump has pressure ratio of less than about 1.1 to 1.5.

8. The multi-pass coaxial gas laser of claim 1 wherein the first spiral nozzle and the second spiral nozzle are ceramic.

9. The multi-pass coaxial gas laser of claim 1 wherein the turbo fan has a first gas flow exit sending the lasing gas to the first anode vessel and a second gas flow exit sending the lasing gas to the second anode vessel.

10. A multi-pass coaxial gas laser, comprising:
a first anode vessel and a cathode vessel, the cathode vessel positioned downstream of the first anode vessel;
a gas feed line extending from a turbo fan to the first anode vessel;
a return gas feed line connecting the cathode vessel to the turbo fan;
an open plasma channel extending from the first anode vessel to the cathode vessel, the open plasma channel forming an optical resonator and having a lasing gas flow entrance, the lasing gas flow entrance having a plurality of spiral gas flow nozzles adjacent to an anode and having a narrowed section downstream of the spiral gas flow nozzles;
the anode in the plasma channel connected to a high voltage DC power supply;
wherein the cathode vessel positions a cathode downstream of a lasing gas flow exit for the plasma channel;
the return gas feed line connecting the cathode vessel to the turbo fan and having a heat exchanger;
an optical beam rear reflecting mirror allowing an optical beam to reflect in the optical resonator;
an optical beam exit output coupler allowing the optical beam to exit the first anode vessel;
a plurality of angled mirrors positioned at a first end and a second end of the optical resonator for redirecting the optical beam through the optical resonator.

11. The gas laser of claim 10 further including a second anode vessel in flow communication with the turbo fan and with the cathode vessel forming a second open plasma channel, the optical resonator extending from the first anode vessel to the second anode vessel and through the cathode vessel, the second anode vessel having a second lasing gas flow entrance, the second lasing gas flow entrance having a second plurality of spiral gas flow nozzles adjacent the anode of the second anode vessel, the second anode vessel having a second narrowed section downstream of the spiral gas flow nozzles.

12. The gas laser of claim 11 wherein the optical beam rear reflecting mirror is in the second anode vessel.

13. The gas laser of claim 10 wherein the optical beam rear reflecting mirror is in the first anode vessel.

14. The gas laser of claim 10 wherein the gas laser has an annular cross section and wherein the plurality of angled mirrors redirect the optical beam through the annular cross section in a spiral direction.

15. The gas laser of claim 11 wherein the first anode vessel anode is electrically connected to a first high voltage power supply and wherein the second anode vessel anode is electrically connected to a second high voltage power supply.

16. A multi-pass coaxial gas laser, comprising:
a first and a second anode vessel with a cathode vessel, the cathode vessel positioned downstream of the first anode vessel and the second anode vessel and positioned therebetween;
a first gas feed line extending from a turbo fan to the first anode vessel;
a second gas feed line extending from the turbo fan to the second anode vessel;
a return gas feed line connecting the cathode vessel to the turbo fan;
an open plasma channel extending from the first anode vessel to the cathode vessel and to the second anode vessel, the open plasma channel forming an optical resonator and having a first and a second lasing gas flow entrance, each of the lasing gas flow entrance having:
a plurality of spiral gas flow nozzles adjacent to an anode and having a narrowed section downstream of the spiral gas flow nozzles, the anode in the plasma channel connected to a high voltage DC power supply;
wherein the cathode vessel positions a cathode downstream of a lasing gas flow exit;
the return gas feed line connecting the cathode vessel to the turbo fan and having a heat exchanger;
a small convex reflector in the first anode vessel;
a singular spherical concave rear reflecting mirror in the second anode vessel opposing the small convex reflector allowing an optical beam to reflect in the optical resonator;
a convex reflector in optical opposition to the spherical concave rear reflecting mirror
an optical beam exit output coupler allowing the optical beam to exit the first anode vessel;
a planar output coupler in optical alignment with the convex reflector to output a ring shaped laser beam.

* * * * *